(12) United States Patent
Han et al.

(10) Patent No.: US 11,037,872 B2
(45) Date of Patent: Jun. 15, 2021

(54) SEMICONDUCTOR DEVICES AND METHODS OF MANUFACTURING THE SAME

(71) Applicant: SAMSUNG ELECTRONICS CO., LTD., Suwon-si (KR)

(72) Inventors: Kyu-Hee Han, Hwaseong-si (KR); Jong-Min Baek, Seoul (KR); Hoon-Seok Seo, Suwon-si (KR); Sang-Hoon Ahn, Hwaseong-si (KR); Woo-Jin Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/374,901

(22) Filed: Apr. 4, 2019

(65) Prior Publication Data

US 2020/0105664 A1    Apr. 2, 2020

(30) Foreign Application Priority Data

Oct. 1, 2018 (KR) .................. 10-2018-0116855

(51) Int. Cl.
*H01L 23/522* (2006.01)
*H01L 21/768* (2006.01)
*H01L 21/02* (2006.01)

(52) U.S. Cl.
CPC .... *H01L 23/5226* (2013.01); *H01L 21/02118* (2013.01); *H01L 21/02271* (2013.01); *H01L 21/7684* (2013.01); *H01L 21/76814* (2013.01); *H01L 21/76822* (2013.01); *H01L 21/76832* (2013.01); *H01L 21/76877* (2013.01)

(58) Field of Classification Search
None
See application file for complete search history.

(56) References Cited

U.S. PATENT DOCUMENTS

| | | | |
|---|---|---|---|
| 6,521,300 B1 | 2/2003 | Hsieh et al. |
| 8,785,215 B2 | 7/2014 | Kobayashi et al. |
| 9,324,650 B2 | 4/2016 | Edelstein et al. |
| 9,530,688 B2 | 12/2016 | Nyhus et al. |
| 9,793,159 B2 | 10/2017 | Wallace et al. |

(Continued)

FOREIGN PATENT DOCUMENTS

KR   10-2009-0046144 A   5/2009

OTHER PUBLICATIONS

T. Chang, et al., "Directed self-assembly of block copolymer films on atomically thin graphene chemical patterns", Scientific Reports, 2016, pp. 1-9.

*Primary Examiner* — Khaja Ahmad
(74) *Attorney, Agent, or Firm* — Lee IP Law, P.C.

(57) ABSTRACT

A semiconductor device and a method of manufacturing a semiconductor device, the semiconductor device including a substrate; a first insulating interlayer on the substrate; a first wiring in the first insulating interlayer on the substrate; an insulation pattern on a portion of the first insulating interlayer adjacent to the first wiring, the insulation pattern having a vertical sidewall and including a low dielectric material; an etch stop structure on the first wiring and the insulation pattern; a second insulating interlayer on the etch stop structure; and a via extending through the second insulating interlayer and the etch stop structure to contact an upper surface of the first wiring.

19 Claims, 19 Drawing Sheets

(56) References Cited

U.S. PATENT DOCUMENTS

| | | | |
|---|---|---|---|
| 2005/0026422 A1* | 2/2005 | Kim | H01L 21/02274 438/624 |
| 2007/0145591 A1* | 6/2007 | Yano | H01L 21/76856 257/758 |
| 2008/0194102 A1* | 8/2008 | Usami | H01L 23/53295 438/653 |
| 2009/0014887 A1* | 1/2009 | Ohtake | H01L 21/76808 257/774 |
| 2009/0152736 A1* | 6/2009 | Watanabe | H01L 21/76846 257/774 |
| 2010/0314777 A1* | 12/2010 | Oda | H01L 23/53238 257/774 |
| 2015/0069620 A1* | 3/2015 | Chi | H01L 23/04 257/774 |
| 2016/0111325 A1* | 4/2016 | JangJian | H01L 21/76877 257/774 |
| 2016/0372415 A1* | 12/2016 | Siew | H01L 21/7682 |
| 2017/0125340 A1* | 5/2017 | Tsai | H01L 21/02178 |
| 2018/0090436 A1 | 3/2018 | Clevenger et al. | |
| 2018/0130708 A1 | 5/2018 | Mohanty et al. | |
| 2019/0181033 A1* | 6/2019 | Penny | H01L 21/76828 |
| 2019/0267278 A1* | 8/2019 | Penny | H01L 21/76832 |
| 2020/0006083 A1* | 1/2020 | Huang | H01L 21/31144 |

* cited by examiner

SEMICONDUCTOR DEVICES AND METHODS OF MANUFACTURING THE SAME

CROSS-REFERENCE TO RELATED APPLICATION

Korean Patent Application No. 10-2018-0116855, filed on Oct. 1, 2018 in the Korean Intellectual Property Office (KIPO), and entitled: "Semiconductor Devices and Methods of Manufacturing the Same," is incorporated by reference herein in its entirety.

BACKGROUND

1. Field

Embodiments relate to semiconductor devices and methods of manufacturing the same.

2. Description of the Related Art

A via under wirings at upper levels may be formed to contact an upper surface of a certain wiring of wirings at lower levels.

SUMMARY

The embodiments may be realized by providing a semiconductor device including a substrate; a first insulating interlayer on the substrate; a first wiring in the first insulating interlayer on the substrate; an insulation pattern on a portion of the first insulating interlayer adjacent to the first wiring, the insulation pattern having a vertical sidewall and including a low dielectric material; an etch stop structure on the first wiring and the insulation pattern; a second insulating interlayer on the etch stop structure; and a via extending through the second insulating interlayer and the etch stop structure to contact an upper surface of the first wiring.

The embodiments may be realized by providing a semiconductor device including a substrate; a wiring on the substrate; a first insulating interlayer on the substrate, the first insulating interlayer covering at least a part of a sidewall of the wiring, and an upper portion of the first insulating interlayer having a carbon concentration that is higher than a carbon concentration of other portions thereof; an insulation pattern on the first insulating interlayer, the insulation pattern including a low dielectric material; an etch stop layer on the wiring and the insulation pattern; a second insulating interlayer on the etch stop layer; and a via extending through the second insulating interlayer and the etch stop layer to contact an upper surface of the wiring.

The embodiments may be realized by providing a semiconductor device including a substrate including a first region and a second region; a first insulating interlayer on the substrate; a first wiring in the first insulating interlayer on the first region of the substrate; a second wiring in the first insulating interlayer on the second region of the substrate; an insulation pattern on a portion of the first insulating interlayer on the first region of the substrate that is adjacent to the first wiring; an etch stop structure on the first insulating interlayer, the first wiring, the second wiring, and the insulation pattern; a second insulating interlayer on the etch stop structure; and a via extending through the second insulating interlayer and the etch stop structure on the first region of the substrate to contact an upper surface of the first wiring, wherein the insulation pattern is not formed on the second region of the substrate.

The embodiments may be realized by providing a method of manufacturing a semiconductor device, the method including forming a wiring in a first insulating interlayer on a substrate; forming a direct self assembly (DSA) layer including a first pattern and a second pattern, the first pattern being arranged on the wiring and the second pattern being arranged on the first insulating interlayer; removing the second pattern to form a first opening exposing an upper surface of the first insulating interlayer; forming an insulation pattern to fill the first opening, the insulation pattern including a low dielectric material; removing the first pattern to form a second opening exposing an upper surface of the wiring; forming an etch stop structure on the exposed upper surface of the wiring and a sidewall and a lower surface of the insulation pattern; forming a second insulating interlayer on the etch stop structure and to fill the second opening; and forming a via through the second insulating interlayer and the etch stop structure, the via contacting the upper surface of the wiring.

The embodiments may be realized by providing a method of manufacturing a semiconductor device, the method including forming a first insulating interlayer on a substrate that includes a first region and a second region such that the first insulating interlayer contains a first wiring on the first region of the substrate and a second wiring on the second region of the substrate; forming a mask on the first insulating interlayer and the second wiring to cover the second region of the substrate; forming an insulation pattern on a portion of the first insulating interlayer on the first region of the substrate; removing the mask; forming an etch stop structure on an upper surface of the first insulating interlayer, an upper surface of the first wiring, an upper surface of the second wiring, and a sidewall and an upper surface of the insulation pattern; forming a second insulating interlayer on the etch stop structure; and forming a via through the second insulating interlayer and the etch stop structure such that the via contacts the upper surface of the first wiring.

BRIEF DESCRIPTION OF THE DRAWINGS

Features will be apparent to those of skill in the art by describing in detail exemplary embodiments with reference to the attached drawings in which.

DETAILED DESCRIPTION

FIGS. 1 to 10 illustrate cross-sectional views of stages in a method of manufacturing a semiconductor device in accordance with example embodiments.

Figure 1:
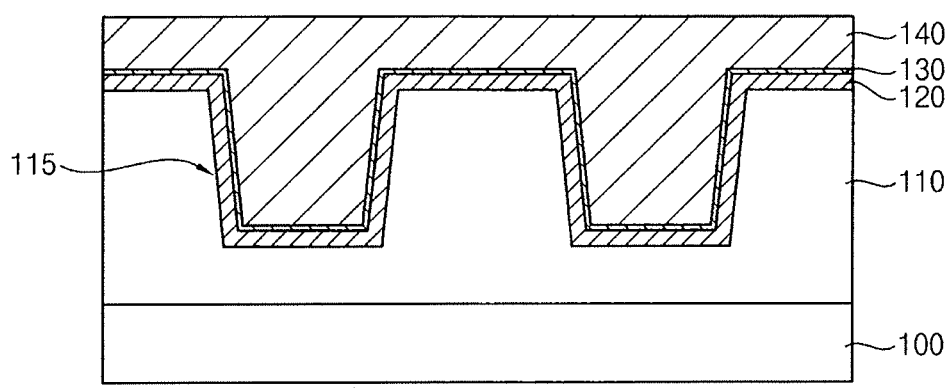
FIGS. 1 to 10 illustrate cross-sectional views of stages in a method of manufacturing a semiconductor device in accordance with example embodiments.

Referring to FIG. 1, a first insulating interlayer 110 may be formed on a substrate 100, an upper portion of the first insulating interlayer 110 may be removed to form a first trench 115, and a wiring layer structure may be formed on the first insulating interlayer 110 to fill the first trench 115.

The substrate 100 may include semiconductor materials, e.g., silicon, germanium, silicon-germanium, or the like, or III-V compounds e.g., gallium phosphide (GaP), gallium arsenide (GaAs), gallium antimonide (GaSb), etc. In an implementation, the substrate 100 may be a silicon-on-insulator (SOI) substrate or a germanium-on-insulator (GOI) substrate.

In an implementation, various elements, e.g., a gate structure, a source/drain layer, a contact plug, or the like, may be formed on the substrate 100, and may be covered by an insulation layer between the substrate 100 and the first insulating interlayer 110.

In an implementation, the first insulating interlayer 110 may include a low dielectric material (e.g., having a dielectric constant of 4.2 or lower). The low dielectric material may include, e.g., a silicon oxide doped with fluorine such as SiOF, a silicon oxide doped with carbon such as SiOCH, an inorganic polymer such as porous silicon oxide, hydrogen silsesquioxane (HSSQ), methyl silsesquioxane (MSSQ), or the like, or a spin on organic polymer.

The first trench 115 may be formed at least at the upper portion of the first insulating interlayer 110. In an implementation, the first trench 115 may extend (e.g., completely) through the first insulating interlayer 110. For example, the first trench 115 may expose an upper surface of an element under the first insulating interlayer 110, and the wiring layer structure filling the first trench 115 may contact and be electrically connected to the element.

The wiring layer structure may include a first barrier layer 120, a first liner layer 130, and a first metal layer 140 (e.g., sequentially stacked in that order along a vertical direction DV). In an implementation, the first barrier layer 120 may be conformally formed on an inner wall of the first trench 115 and an upper surface of the first insulating interlayer 110, the first liner layer 130 may be conformally formed on the first barrier layer 120, and the first metal layer 140 may be formed on the first liner layer 130 to fill the first trench 115.

The first barrier layer 120 may include a metal nitride, e.g., titanium nitride, tantalum nitride, or the like, the first liner layer 130 may include a metal, e.g., cobalt, ruthenium, or the like, and the first metal layer 140 may include a low resistance metal, e.g., copper, aluminum, tungsten, or the like.

Figure 2:
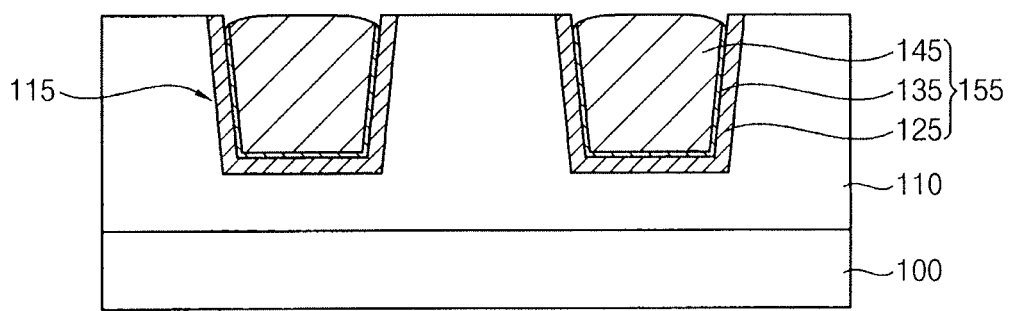

Referring to FIG. 2, the wiring layer structure may be planarized until the upper surface of the first insulating interlayer 110 is exposed, and thus a first wiring 155 may be formed in the first trench 115. For example, the upper surface of the first insulating interlayer 110 may be coplanar with an upper surface of the first wiring 155.

The planarization process may include, e.g., a chemical mechanical polishing (CMP) process and/or an etch back process.

The first wiring 155 may include a first metal pattern 145, a first liner 135 covering a lower (e.g., substrate-facing) surface and a sidewall of the first metal pattern 145, and a first barrier pattern 125 covering a lower surface and a sidewall of the first liner 135.

When the first liner layer 130 includes cobalt, more of the first liner layer 130 may be removed than the first barrier layer 120 during the planarization process. For example, a height of an uppermost surface of the first liner 135 may be lower (e.g., closer to the substrate 100 along the vertical direction DV) than a height of an uppermost surface of the first barrier pattern 125. In an implementation, an edge or edges of the first metal pattern 145 adjacent to the first liner 135 may have an upper surface that is lower than that of a central portion thereof. For example, the upper surface of the central portion of the first metal pattern 145 and the uppermost surface of the first barrier pattern 125 may be higher (e.g., farther from the substrate 100 along the vertical direction DV) than the upper surface of the edge of the first metal pattern 145 and higher the uppermost surface of the first liner 135.

Figure 3:
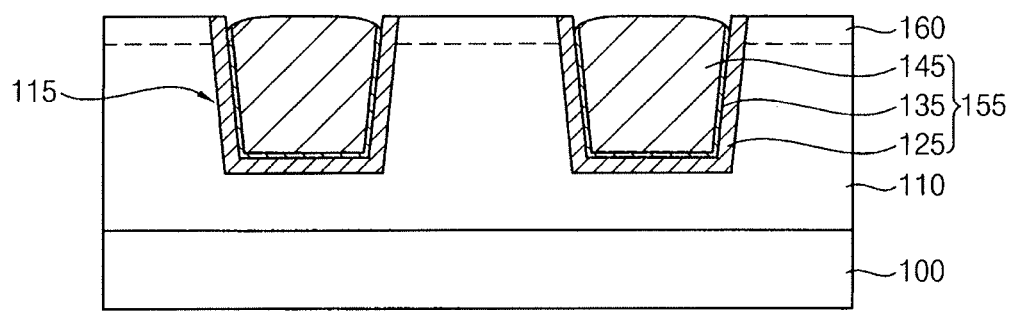

Referring to FIG. 3, a first surface treatment process and a second surface treatment process may be performed on an upper surface of the first wiring 155 and an upper portion of the first insulating interlayer 110, respectively. For example, the first surface treatment process may be performed on the upper surface of the first wiring 155 and the second surface treatment process may be performed on the upper portion of the first insulating interlayer 110.

In an implementation, the first surface treatment process may include reducing or removing a metal oxide on or at the upper surface of the first wiring 155.

In an implementation, the second surface treatment process may include doping carbon into the upper portion of the first insulating interlayer 110. In an implementation, when the first insulating interlayer 110 already includes carbon, e.g., SiOCH, a carbon concentration of the upper portion of the first insulating interlayer 110 may be higher than a carbon concentration of other portions thereof. For example, a high carbon concentration region may be formed. In an implementation, when the first insulating interlayer 110 does not already include carbon, e.g., when the first insulating interlayer 110 includes SiOF, a carbon-containing layer may be formed at the upper portion of the first insulating interlayer 110. Hereinafter, both of the high carbon concentration region or the carbon-containing layer may be denoted by reference numeral 160. In an implementation, the high carbon concentration region 160 or the carbon-containing layer 160 may have hydrophobicity that is not well coupled to water.

Figure 4:
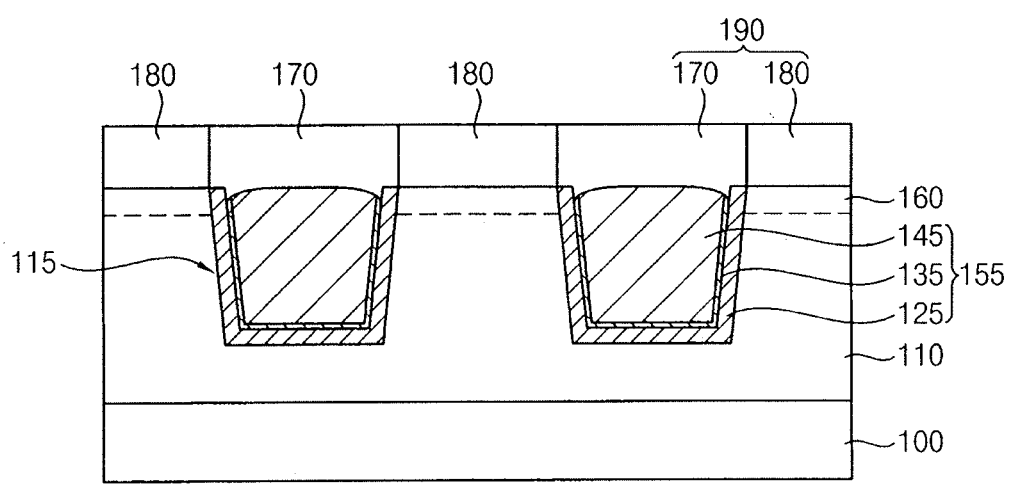

Referring to FIG. 4, a direct self assembly process may be performed to form a direct self assembly (DSA) layer 190 on the first wiring 155 and the first insulating interlayer 110. In an implementation, the DSA layer 190 may be formed by applying a composition including block copolymer (BCP) on the first wiring 155 and the first insulating interlayer 110 by a spin coating process.

The BCP may be a copolymer of two polymer units having different chemical properties. For example, the BCP may be synthesized by copolymerizing a first polymer unit and a second polymer unit by, e.g., anionic polymerization or cationic polymerization. In an implementation, the first polymer unit may have hydrophilicity that is stronger than that of the second polymer unit.

In an implementation, the first polymer unit may include, e.g., polymethylmethacrylate (PMMA), polydimethylsiloxane (PDMS), polyvinylpyrrolidone (PVP), polyethyleneoxide (PEO), polylactide (PLA) or polyimide (PI). In an implementation, the second polymer unit may include, e.g., polystyrene (PS).

In an implementation, the block copolymer may be denoted by PS-b-PMMA, PS-b-PDMS, PS-b-PVP, PS-b-PEO, PS-b-PLA or PS-b-PI. Hereinafter, an example is described in which the first polymer unit and the second polymer unit are PMMA and PS, respectively, and the BCP is PS-b-PMMA. In this case, the BCP may include a first pattern 170 including PMMA and a second pattern 180 including PS.

In an implementation, the first and second patterns 170 and 180 may be self aligned on the upper surfaces of the first wiring 155 and the first insulating interlayer 110, respectively. The metal oxide on the upper surface of the first wiring 155 may be removed by the first surface treatment process, and the first pattern 170 may be easily arranged on the first wiring 155. Additionally, the high carbon concentration region 160 or the carbon-containing layer 160 (having hydrophobicity) may be formed on the upper portion of the first insulating interlayer 110 by the second surface treatment process, and the second pattern 180 may be easily arranged on the first insulating interlayer 110.

Figure 5:
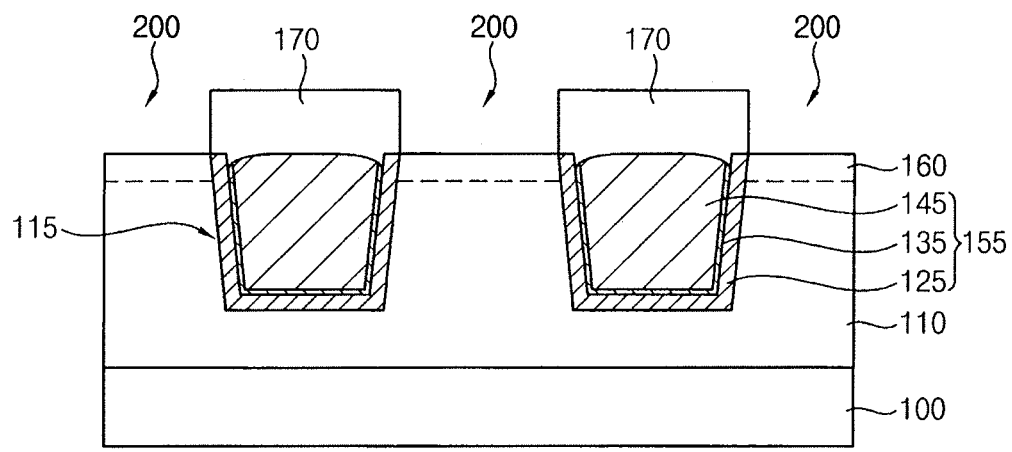

Referring to FIG. 5, the second pattern 180 of the DSA layer 190 may be removed, and a first opening 200 exposing the upper surface of the first insulating interlayer 110, e.g., the upper surface of the high carbon concentration region 160 or the carbon-containing layer 160 may be formed. In an implementation, the second pattern 180 may be removed by a stripping process.

Figure 6:
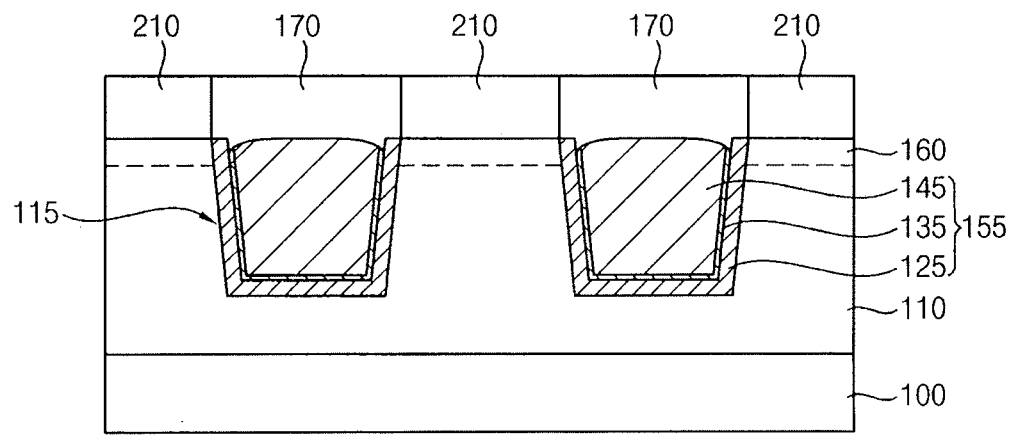

Referring to FIG. 6, a first insulation pattern 210 may be formed on the exposed upper surface of the first insulating interlayer 110 to fill the first opening 200. In an implementation, the first insulation pattern 210 may be formed by forming a first insulation layer on the exposed upper surface of the first insulating interlayer 110 and an upper surface of the first pattern 170 of the DSA layer 190 to fill the first opening 200, and planarizing the first insulation layer until the upper surface of the first pattern 170 is exposed.

In an implementation, the first insulation layer may be formed by a flowable chemical vapor deposition (FCVD) process and may include a low dielectric material having a dielectric constant of 4.2 or lower. In an implementation, the first insulation pattern 210 may include, e.g., a silicon oxide doped with fluorine (such as SiOF), a silicon oxide doped with carbon (such as SiOCH), an inorganic polymer (such as porous silicon oxide), hydrogen silsesquioxane (HSSQ), methyl silsesquioxane (MSSQ), a spin on organic polymer, or the like. In an implementation, the first insulation pattern 210 may include a material substantially the same as that of the first insulating interlayer 110 thereunder. In an implementation, the material of the first insulation pattern 210 may be distinguished from the material of the first insulating interlayer by the high carbon concentration region 160 or the carbon-containing layer 160.

Figure 7:
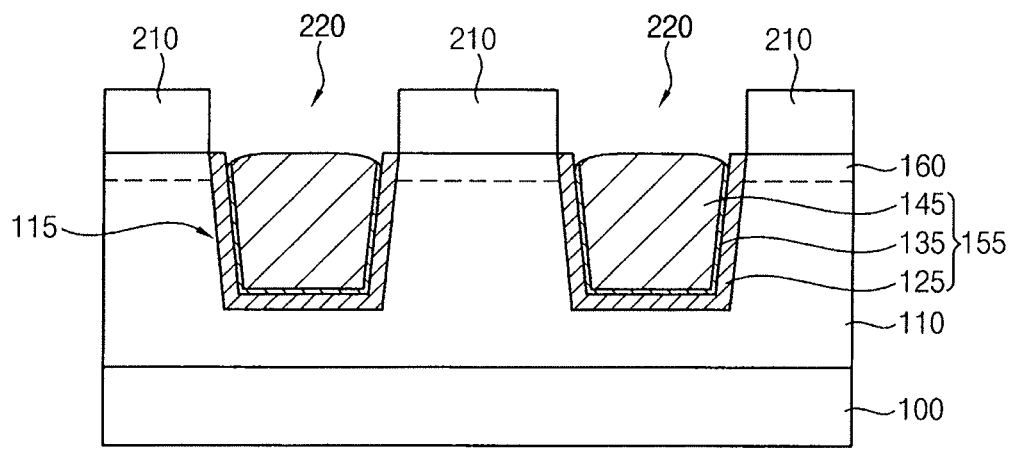

Referring to FIG. 7, the first pattern 170 of the DSA layer 190 may be removed, and a second opening 220 exposing the upper surface of the first wiring 155 may be formed. In an implementation, the first pattern 170 may be removed by a curing process using ultraviolet rays.

Figure 8:
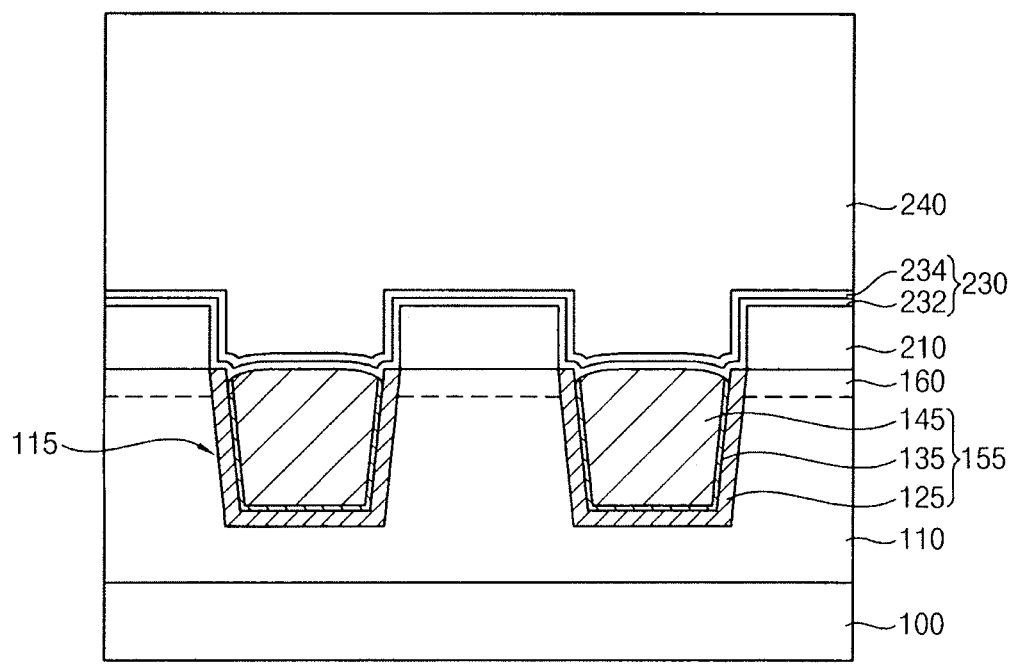

Referring to FIG. 8, after forming an etch stop structure 230 on the exposed upper surface of the first wiring 155, a sidewall of the second opening 220, and an upper surface of the first insulation pattern 210, a second insulating interlayer 240 (filling a remaining portion of the second opening 220) may be formed on the etch stop structure 230 to a sufficient height.

In an implementation, the etch stop structure 230 may include a sequentially stacked first etch stop layer 232 and second etch stop layer 234. The first etch stop layer 232 may include, e.g., aluminum oxide, aluminum nitride, or the like, and the second etch stop layer 234 may include, e.g., silicon carbide, silicon nitride, silicon carbonitride, or the like. In an implementation, the order of stacking the first and second etch stop layers 232 and 234 in the etch stop structure 230 may be reversed (e.g., the second etch stop layer 234 may be between the substrate 100 and the first etch stop layer 232).

The second insulating interlayer 240 may include a low dielectric material having a dielectric constant of 4.2 or lower. In an implementation, the second insulating interlayer 240 may include, e.g., a silicon oxide doped with fluorine (such as SiOF), a silicon oxide doped with carbon (such as SiOCH), an inorganic polymer (such as porous silicon oxide), hydrogen silsesquioxane (HSSQ), methyl silsesquioxane (MSSQ), a spin on organic polymer, or the like.

Figure 9:
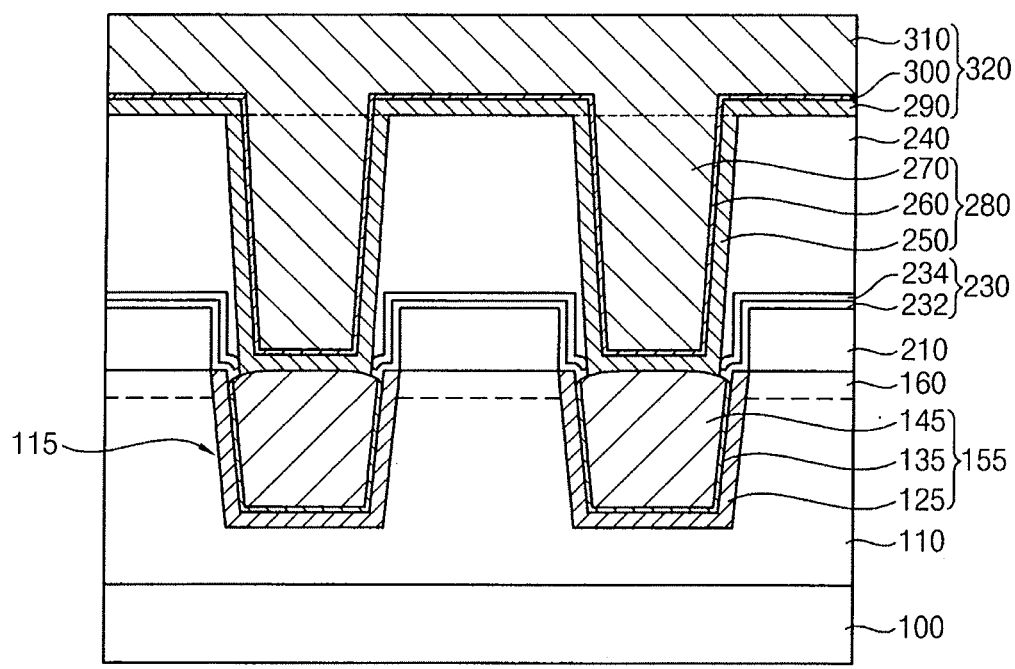

Referring to FIG. 9, a via 280 (extending through a lower portion of the second insulating interlayer 240 along the vertical direction DV to contact the upper surface of the first wiring 155) may be formed. A second wiring 320 (extending through an upper portion of the second insulating interlayer 240 to contact an upper surface of the via 280) may also be formed to complete the fabrication of the semiconductor device.

In an implementation, the via 280 and the second wiring 320 may be simultaneously formed by a dual damascene process, and may be integrally formed with each other. For example, the via 280 and the second wiring 320 may be formed by forming a via hole extending through the lower portion of the second insulating interlayer 240 and the etch stop structure 230 to expose the upper surface of the first wiring 155, and a second trench extending through the upper portion of the second insulating interlayer 240 (to be connected to the via hole), sequentially forming a second barrier layer and a second liner layer on inner walls of the via hole and the second trench, the exposed upper surface of the first wiring 155, and an upper surface of the second insulating interlayer 240, forming a second metal layer on the second liner layer to fill the via hole and the second trench, and planarizing the second metal layer, the second liner layer, and the second barrier layer until the upper surface of the second insulating interlayer 240 is exposed.

For example, the via 280 may include a second metal pattern 270, a second liner 260 (covering a lower surface and a sidewall of the second metal pattern 270), and a second barrier pattern (covering a lower surface and a sidewall of the second liner 260 and contacting the upper surface of the first wiring 155). In an implementation, the second wiring 320 may include a third metal pattern 310 (contacting an upper surface of the second metal pattern 270), a third liner 300 (covering a portion of a lower surface and a sidewall of the third metal pattern 310), and a third barrier pattern 290 (covering a lower surface and a sidewall of the third liner 300 along the vertical direction DV). In an implementation, the second and third metal patterns 270 and 310, the second and third liners 260 and 300, and the second and third barrier patterns 250 and 290 may be each integrally formed so as to contact each other and include the same material. A lower surface of the via 280 may be in contact, e.g., direct contact, with an upper surface of the wiring 155, e.g., along the vertical direction DV.

The second barrier layer may include a metal nitride, e.g., titanium nitride, tantalum nitride, or the like, the second liner layer may include a metal, e.g., cobalt, ruthenium, or the like, and the second metal layer may include a low resistance metal, e.g., copper, aluminum, tungsten, or the like.

Figure 10:
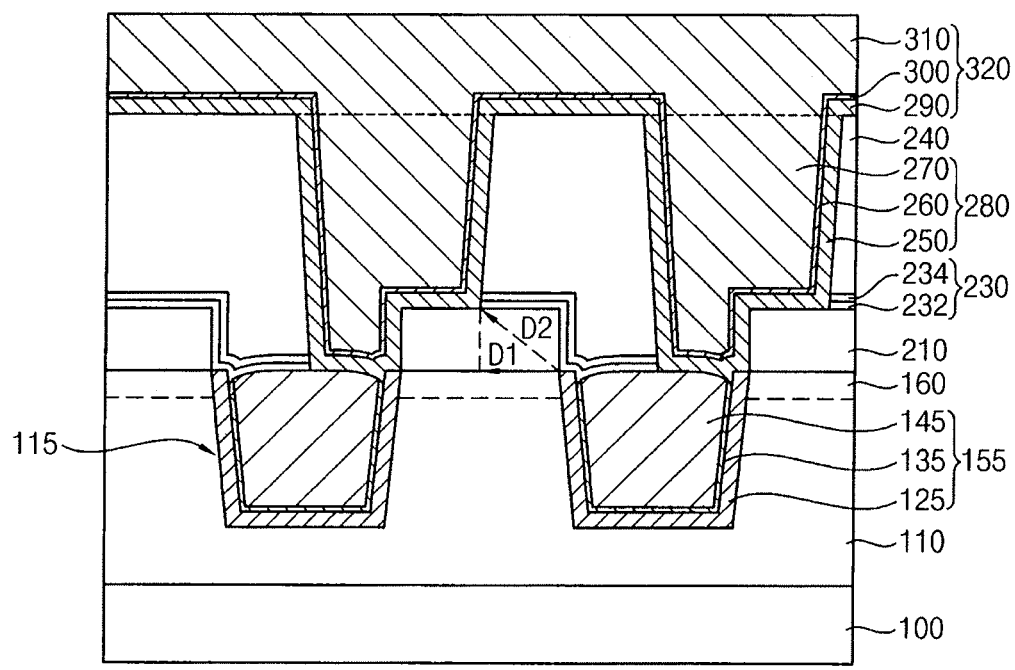

FIG. 10 illustrates a misalignment between the via 280 and the first wiring 155 in which the via 280 is not well aligned to the upper surface of the first wiring 155. For example, the via 280 may contact not only the upper surface of the first wiring 155, but also a sidewall and the upper surface of the first insulation pattern 210 adjacent thereto.

If the first insulation pattern 210 were not formed, the via 280 could contact the upper surface of the first insulating interlayer 110, and a minimum distance between the via 280 and one of the first wirings 155 that does not contact the via 280 but is adjacent thereto would be a first distance D1 along a first horizontal direction DH1. According to an embodiment, the first insulation pattern 210 may be formed, and a minimum distance therebetween may be a second distance D2 along a diagonal between the first horizontal direction DH1' and the vertical direction DV, which may be greater than the first distance D1. Accordingly, the electrical short margin between the via 280 and the neighboring first wiring 155 may be advantageously increased, allowing a misaligned structure to still be acceptable.

The semiconductor device described in FIGS. 9 and 10 may have following characteristics.

For example, the first insulation pattern 210 may be formed on the first insulating interlayer 110 adjacent to the first wiring 155, the first insulation pattern 210 may be formed by performing a DSA process, and the first insulation pattern 210 may have a substantially vertical sidewall (e.g., a sidewall that is orthogonal to a surface of the substrate 100). For example, the sidewall may be vertical within manufacturing tolerances. In an implementation, the first and second surface treatment processes may be performed before the DSA process, and the high carbon concentration region 160 or the carbon-containing layer 160 may be formed at the upper portion of the first insulating interlayer 110.

The first insulation pattern 210 and the second insulating interlayer 240 may be formed on the first insulating interlayer 110. Both of the first insulation pattern 210 and the second insulating interlayer 240 may have a low dielectric material having a dielectric constant of 4.2 or lower. For example, when a plurality of first wirings 155 is formed in one direction, undesirable increases of a parasitic capacitance in horizontal directions DH1 and DH2 between the first wirings 155 and a parasitic capacitance in the vertical direction DV between the first and second wirings 155 and 320 may be prevented.

Figure 11:
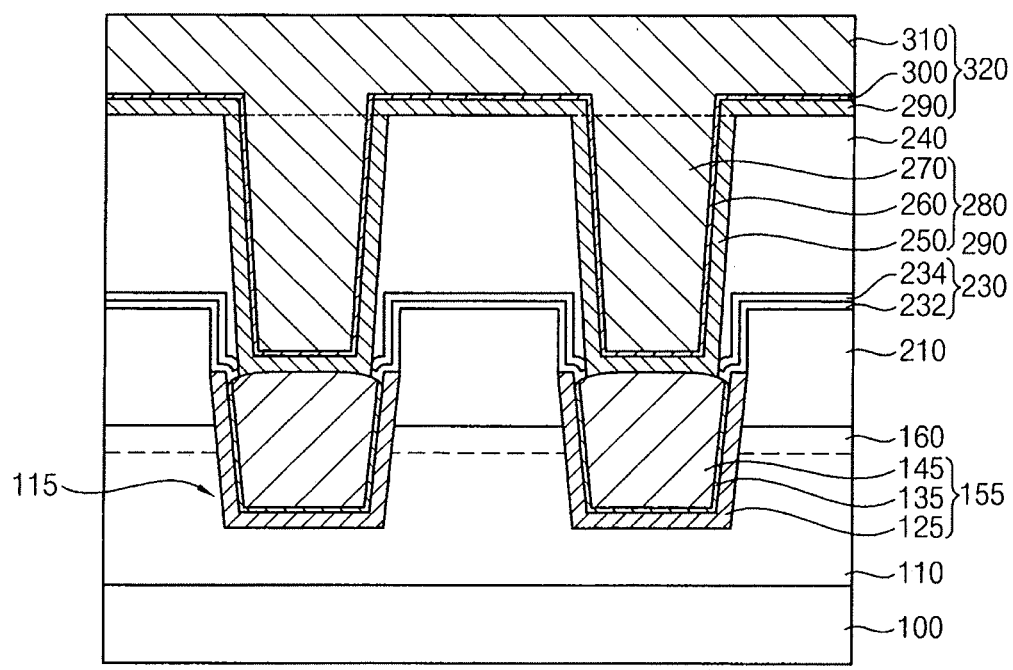
FIG. 11 illustrates a cross-sectional view of a semiconductor device in accordance with example embodiments.

FIG. 11 illustrates a cross-sectional view of a semiconductor device in accordance with example embodiments. This semiconductor device is substantially the same as or similar to the semiconductor device described in FIG. 9, except for the height of the upper surface of the first insulating interlayer. Accordingly, like reference numerals refer to like elements, and repeated detailed descriptions thereof may be omitted herein.

Referring to FIG. 11, a height of the upper surface of the first insulating interlayer 110 may be lower (e.g., closer to the substrate 100) than a height of the upper surface of the first wiring 155. For example, a height of a lower surface of the first insulation pattern 210 on the first insulating interlayer 110 may also be lower than the height of the upper surface of the first wiring 155.

This may be implemented by performing a process of removing the upper portion of the first insulating interlayer 110 after the processes described in FIGS. 1 and 2.

As the height of the upper surface of the first insulating interlayer 110 decreases, a height of the upper surface of the high carbon concentration region 160 or the carbon-containing layer 160 may also decrease to be lower than the height of the upper surface of the first wiring 155.

Figure 12:
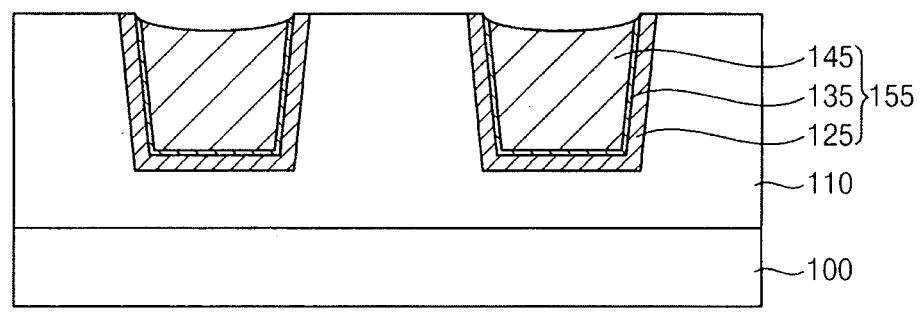
FIGS. 12 to 14 illustrate cross-sectional views of stages in a method of manufacturing a semiconductor device in accordance with example embodiments.
Figure 13:
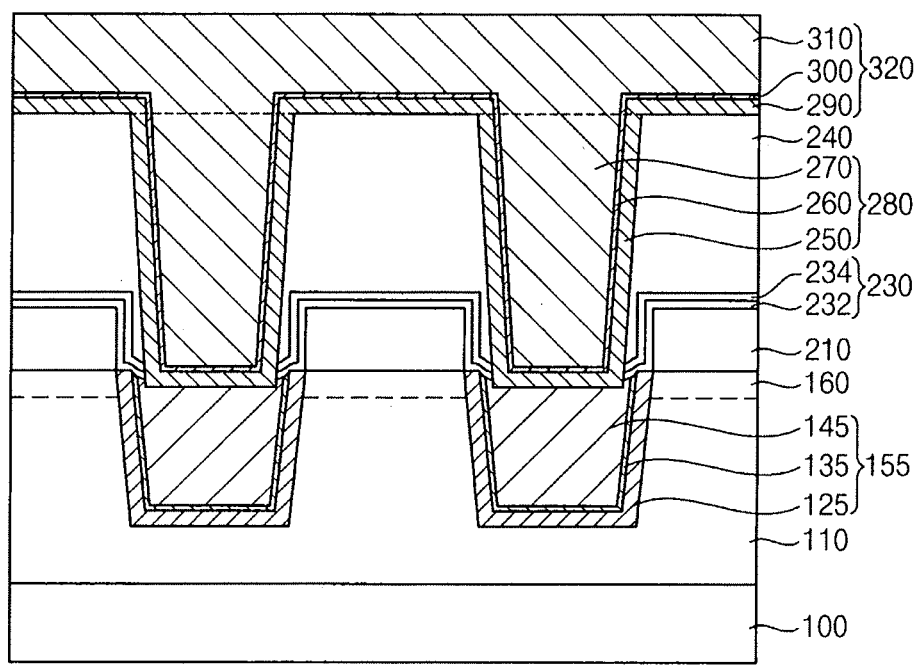
Figure 14:
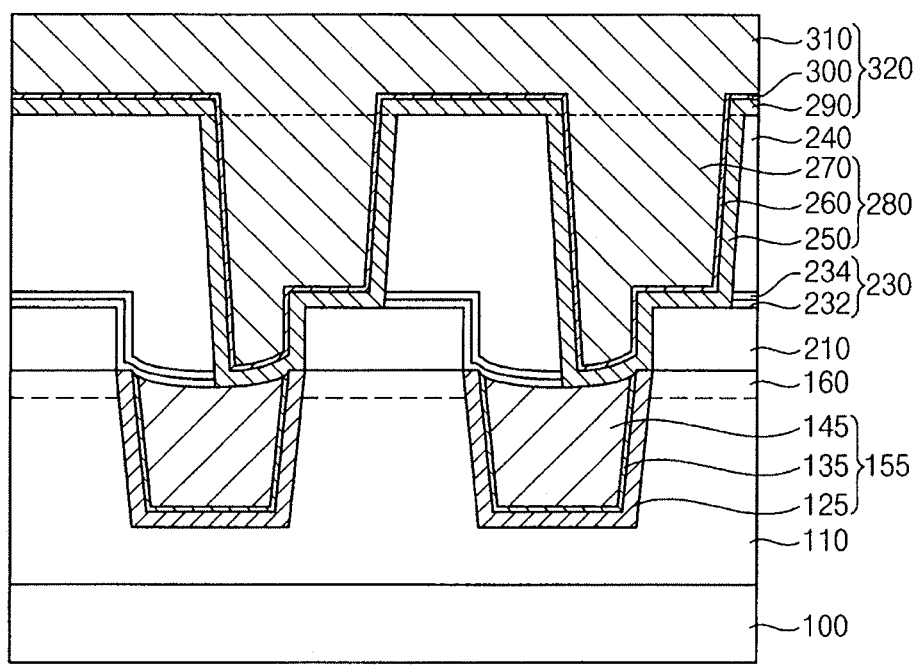

FIGS. 12 to 14 illustrate cross-sectional views of stages in a method of manufacturing a semiconductor device in accordance with example embodiments. This method of manufacturing the semiconductor device includes processes substantially the same as or similar to the processes described in FIGS. 1 to 10, and repeated detailed descriptions thereof may be omitted herein.

Referring to FIG. 12, processes substantially the same as or similar to the processes described in FIGS. 1 and 2 may be performed.

According to the present embodiment, the first liner layer 130 may include ruthenium instead of cobalt. After performing the planarization process, the height of the uppermost surface of the first liner 135 and a height of the upper surface of the first metal pattern 145 may be lower than the height of the uppermost surface of the first barrier pattern 125. In an implementation, the edge of the first metal pattern 145 (adjacent to the first liner 135) may have an upper surface that is higher than that of a central portion thereof. For example, the upper surface of the central portion of the first metal pattern 145 may be lower (e.g., closer to the substrate 100) than the upper surface of the edge of the first metal pattern 145 and the uppermost surface of the first barrier pattern 125.

Referring to FIG. 13, processes substantially the same as or similar to the processes described in FIGS. 3 to 9 may be performed to complete the fabrication of the semiconductor device.

Similar to FIG. 10, FIG. 14 illustrates misalignment between the via 280 and the first wiring 155 in which the via 280 is not well aligned to the upper surface of the first wiring 155.

FIGS. 15 to 20 illustrate cross-sectional views of stages in a method of manufacturing a semiconductor device in accordance with example embodiments. This method of manufacturing the semiconductor device includes processes substantially the same as or similar to the processes described in FIGS. 1 to 10, so that like reference numerals refer to like elements, and repeated detailed descriptions thereof may be omitted herein.

Figure 15:
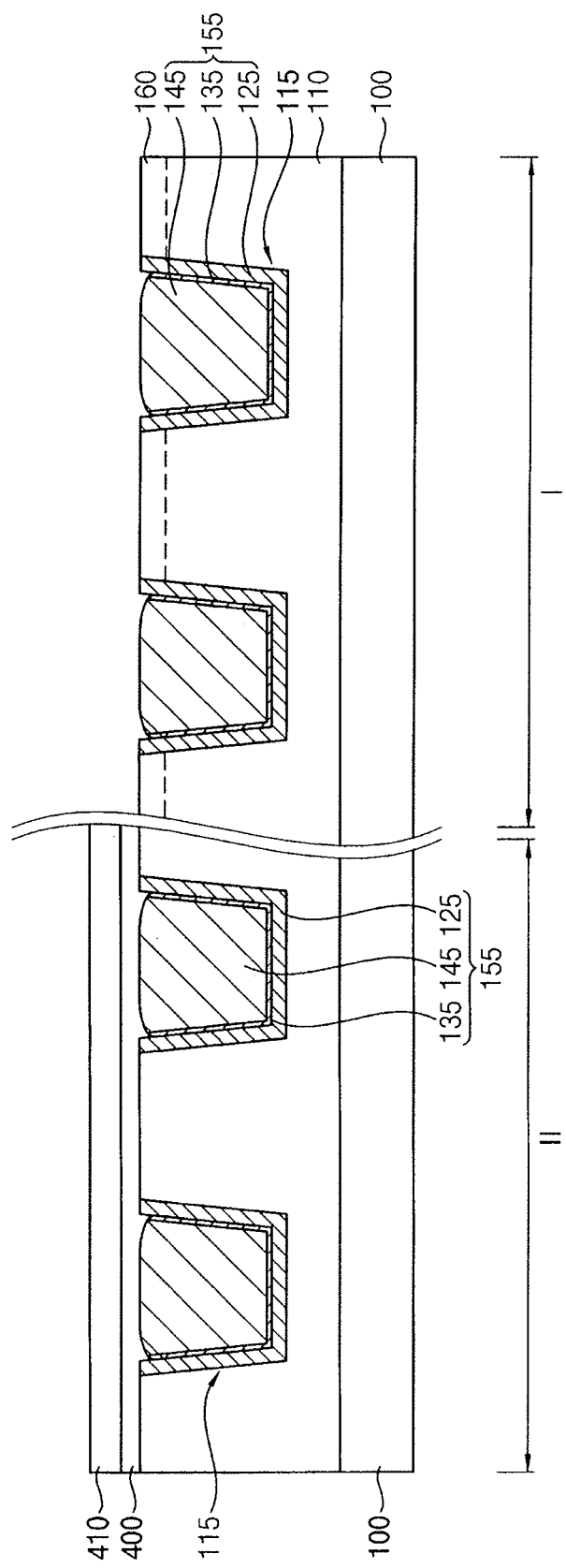
FIGS. 15 to 20 illustrate cross-sectional views of stages in a method of manufacturing a semiconductor device in accordance with example embodiments.

Referring to FIG. 15, processes substantially the same as or similar to the processes described in FIGS. 1 and 2 may be performed.

According to the present embodiment, the substrate 100 may include a first region I and a second region II. A mask structure covering the second region II of the substrate 100 may be formed on the first wiring 155 and the first insulating interlayer 110.

In an implementation, the mask structure may include a sequentially stacked first mask 400 and second mask 410. In an implementation, the first mask 400 may include, e.g., aluminum nitride, and the second mask 410 may include, e.g., silicon nitride.

The first and second surface treatment processes described in FIG. 3 may be performed to remove the metal oxide of the upper surface of the first wiring 155 on the first region I of the substrate 100, and the high carbon concentration region 160 or the carbon-containing layer 160 may be formed at the upper portion of the first insulating interlayer 110 (also on the first region I of the substrate 100).

Figure 16:
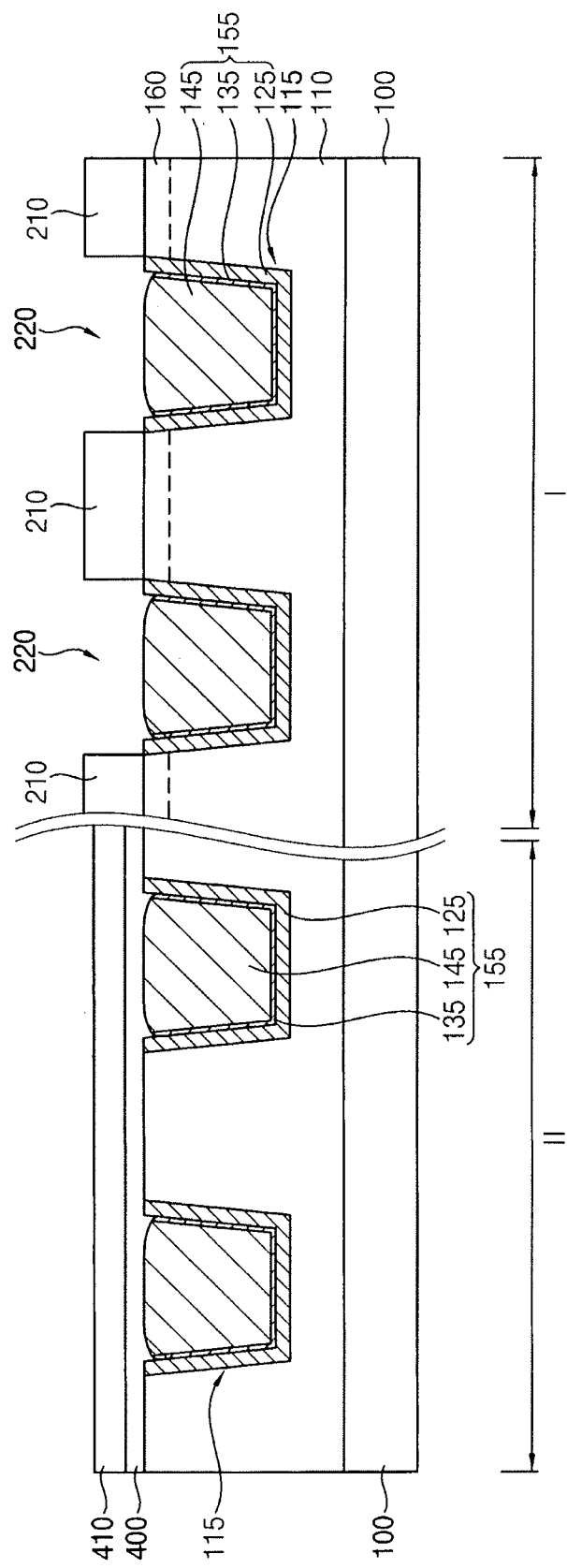

Referring to FIG. 16, processes substantially the same as or similar to the processes described in FIGS. 4 to 7 may be performed.

Accordingly, the first insulation pattern 210 may be formed on the upper surface of the first insulating interlayer 110, e.g., the upper surface of the high carbon concentration region 160 or the carbon-containing layer 160 on the first region I of the substrate 100, and the second opening 220 exposing the upper surface of the first wiring 155 on the first region I of the substrate 100 may be formed.

Figure 17:
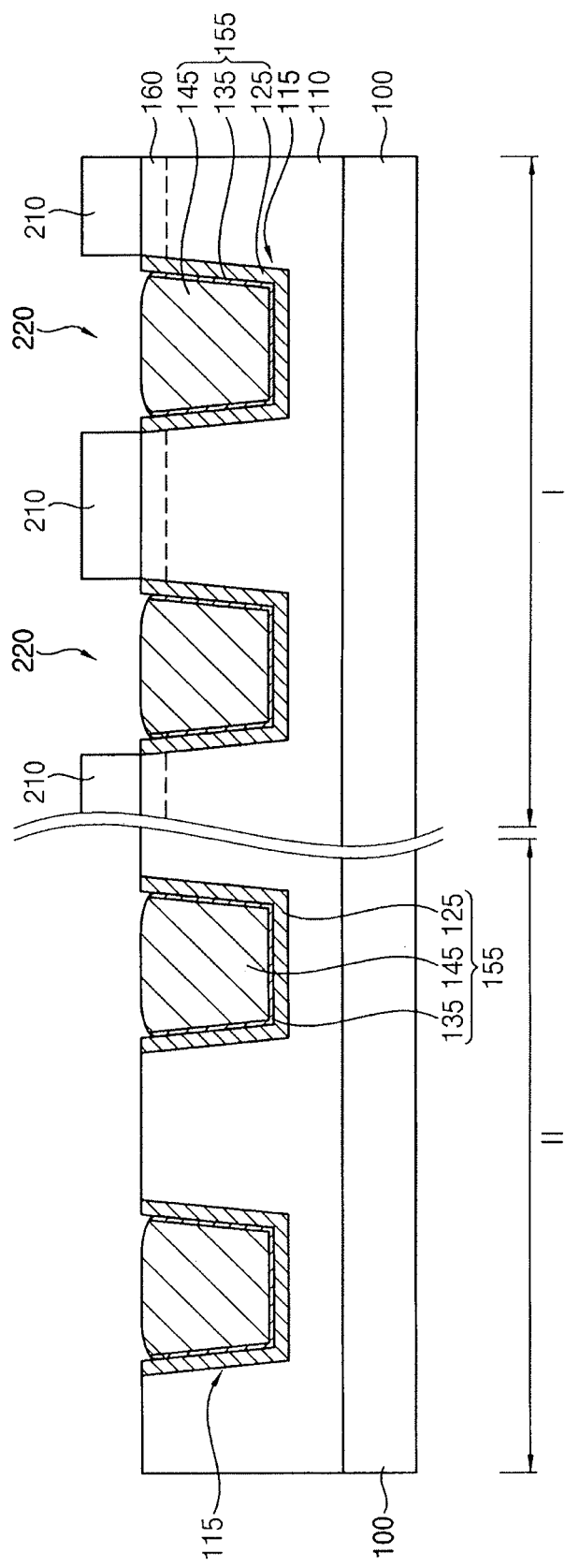

Referring to FIG. 17, the mask structure on the second region II of the substrate 100 may be removed, and portions of the first wiring 155 and the first insulating interlayer 110 on the second region II of the substrate 100 may be exposed.

Figure 18:
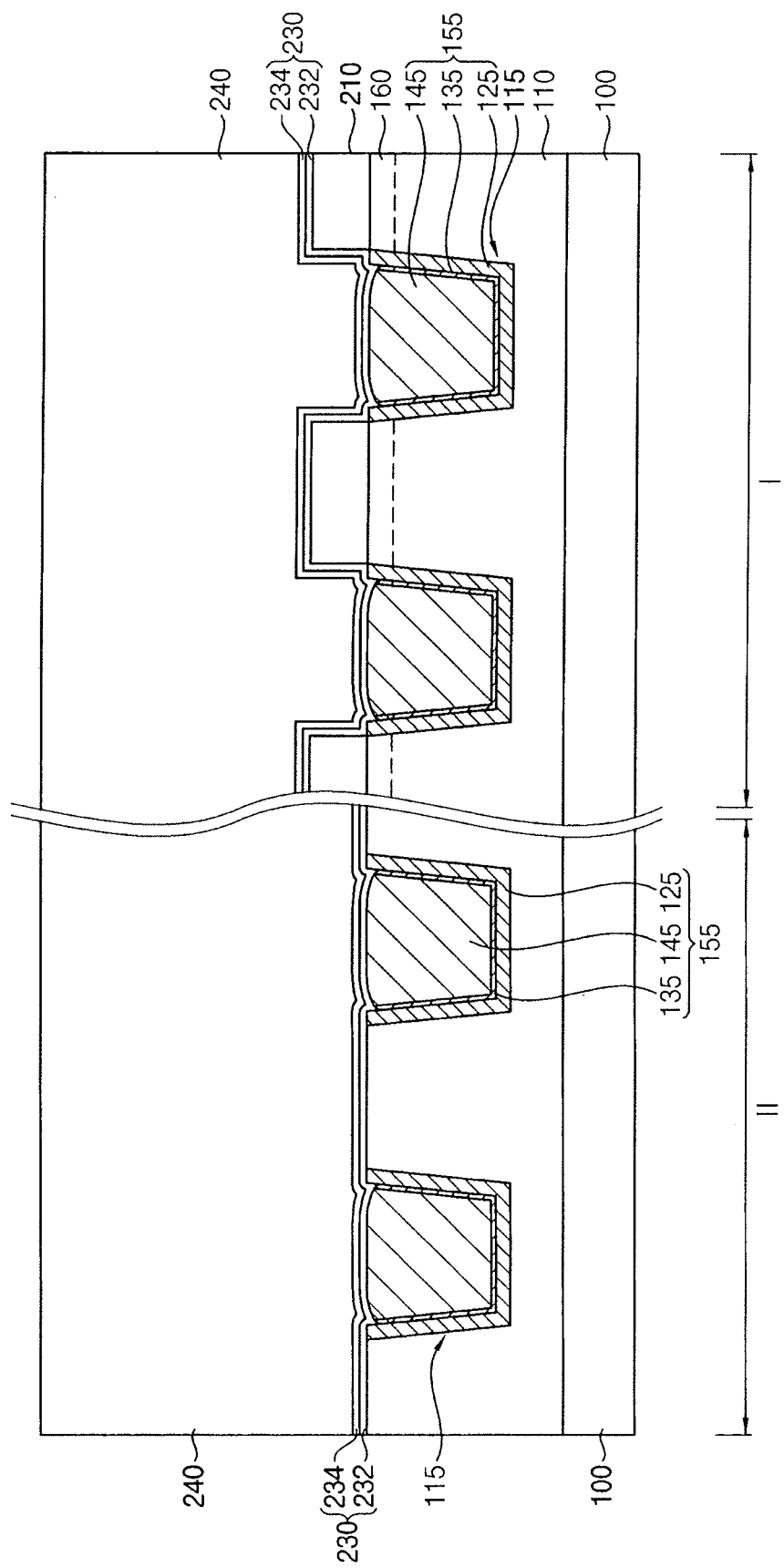

Referring to FIG. 18, processes substantially the same as or similar to the processes described in FIG. 8 may be performed.

For example, the etch stop structure 230 may be formed on the upper surface of the first wiring 155, the sidewall of the second opening 220 and the upper surface of the first insulation pattern 210 on the first region I of the substrate 100, and the upper surface of the first wiring 155 and the upper surface of the first insulating interlayer 110 on the second region II of the substrate 100. The second insulating interlayer 240 may be formed on the etch stop structure 230.

Figure 19:
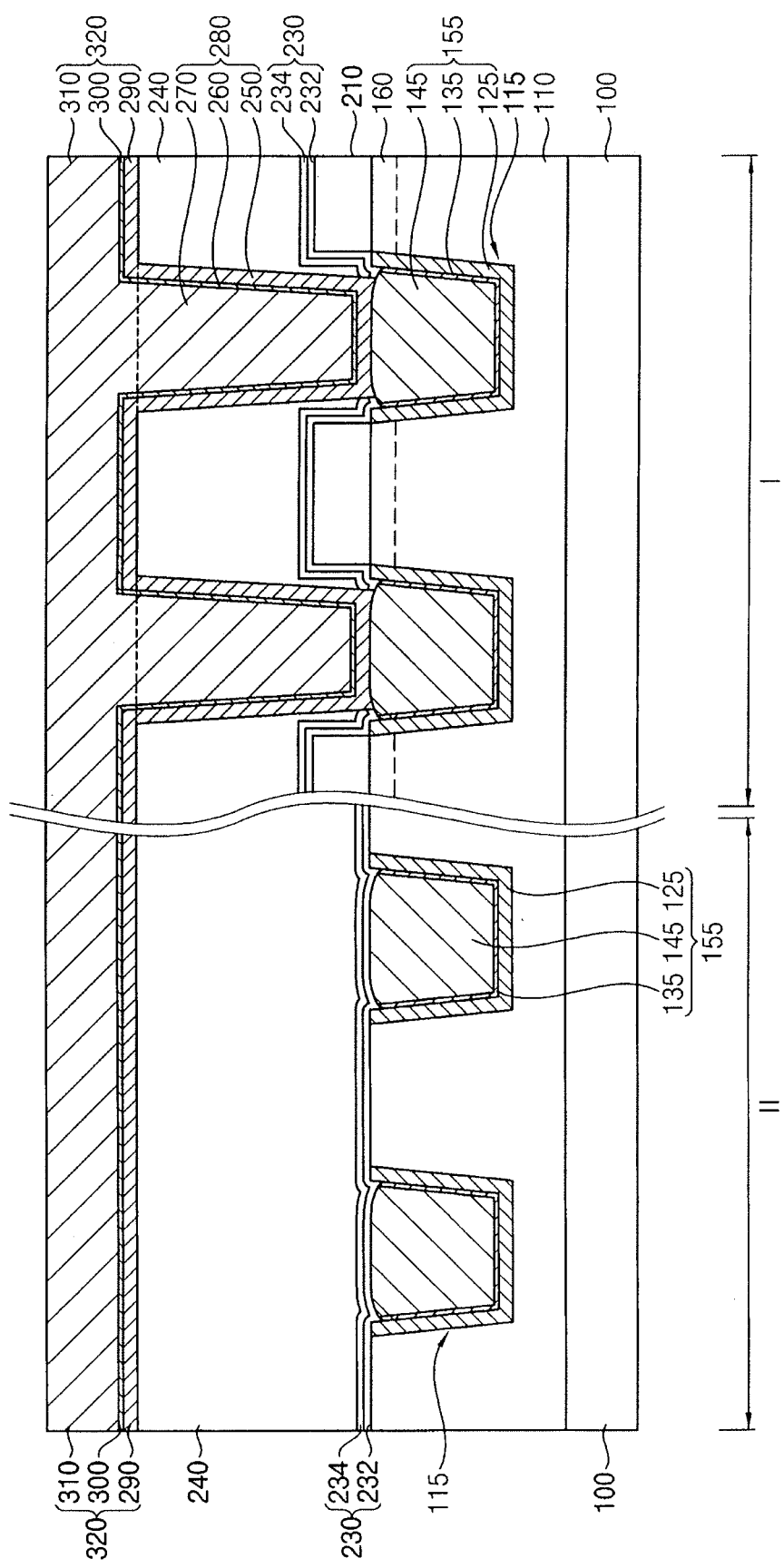

Referring to FIG. 19, processes substantially the same as or similar to the processes described in FIG. 9 may be performed to complete the fabrication of the semiconductor device.

According to the present embodiment, the via 280 may be formed only on the first region I of the substrate 100, and may contact only the first wiring 155 on the first region I of the substrate 100.

Figure 20:
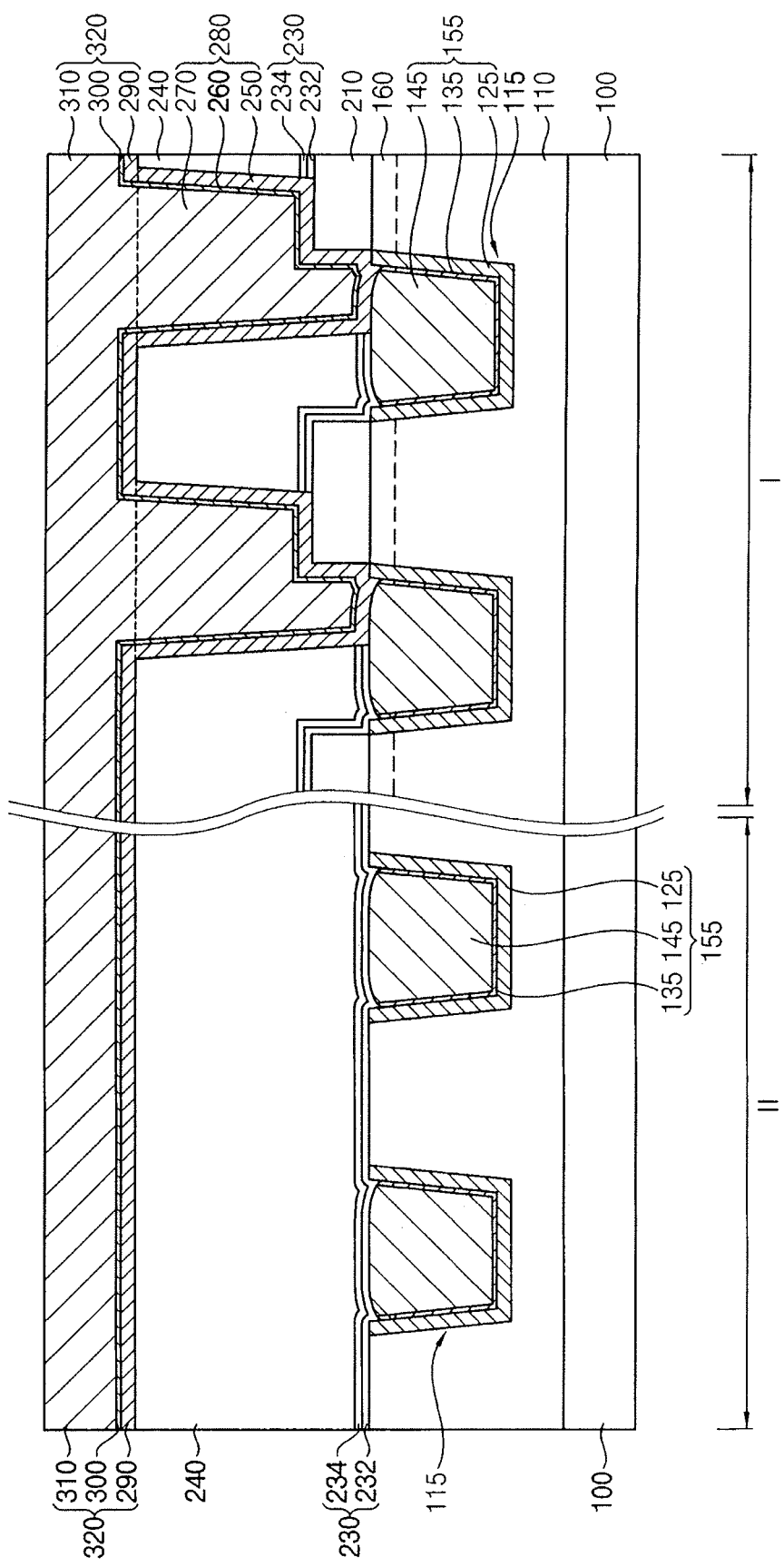

Similar to FIG. 10, FIG. 20 illustrates a misalignment between the via 280 and the first wiring 155 in which the via 280 is not well aligned to the upper surface of the first wiring 155.

In the semiconductor device illustrated in FIGS. 19 and 20, the first insulation pattern 210 may not be formed on the second region II of the substrate 100 on which the via 280 is not formed. For example, the first insulation pattern 210 may be formed in order to increase the electrical short margin between the via 280 and the neighboring first wiring 155 and may not be formed on the second region II of the substrate 100 on which the via 280 is not formed.

FIGS. 21 to 24 illustrate cross-sectional views of stages in a method of manufacturing a semiconductor device in accordance with example embodiments. This method of manufacturing the semiconductor device includes processes substantially the same as or similar to the processes described in FIGS. 15 to 20, and repeated detailed descriptions thereof may be omitted herein.

Figure 21:
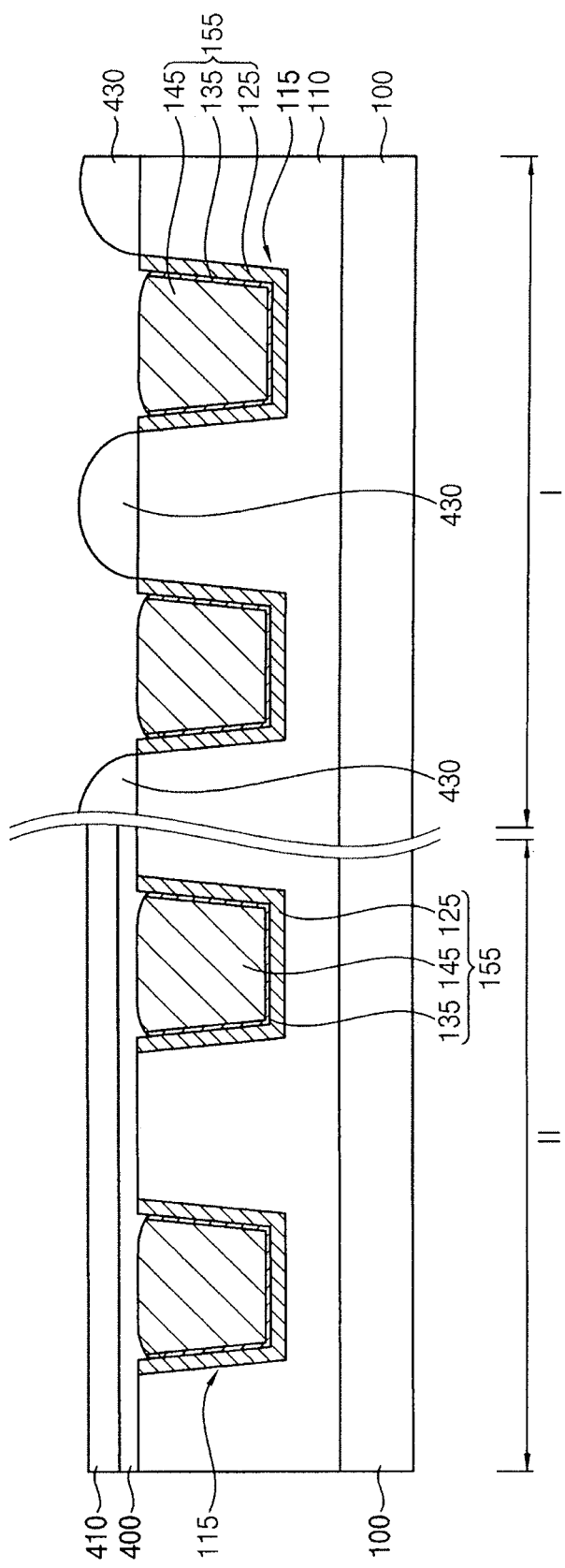
FIGS. 21 to 24 illustrate cross-sectional views of stages in a method of manufacturing a semiconductor device in accordance with example embodiments.

Referring to FIG. 21, processes substantially the same as or similar to the processes described in FIG. 15 may be performed.

In an implementation, the first and second surface treatment processes may not be performed.

Referring to FIG. 21, a second insulation pattern 430 may be formed only on a portion of the first insulating interlayer 110 on the first region I of the substrate 100 by a selective deposition process. In an implementation, the second insulation pattern 430 may have a rounded or inclined sidewall.

In an implementation, the second insulation pattern 430 may include a high dielectric material, e.g., aluminum oxide, aluminum nitride, or the like.

Figure 22:
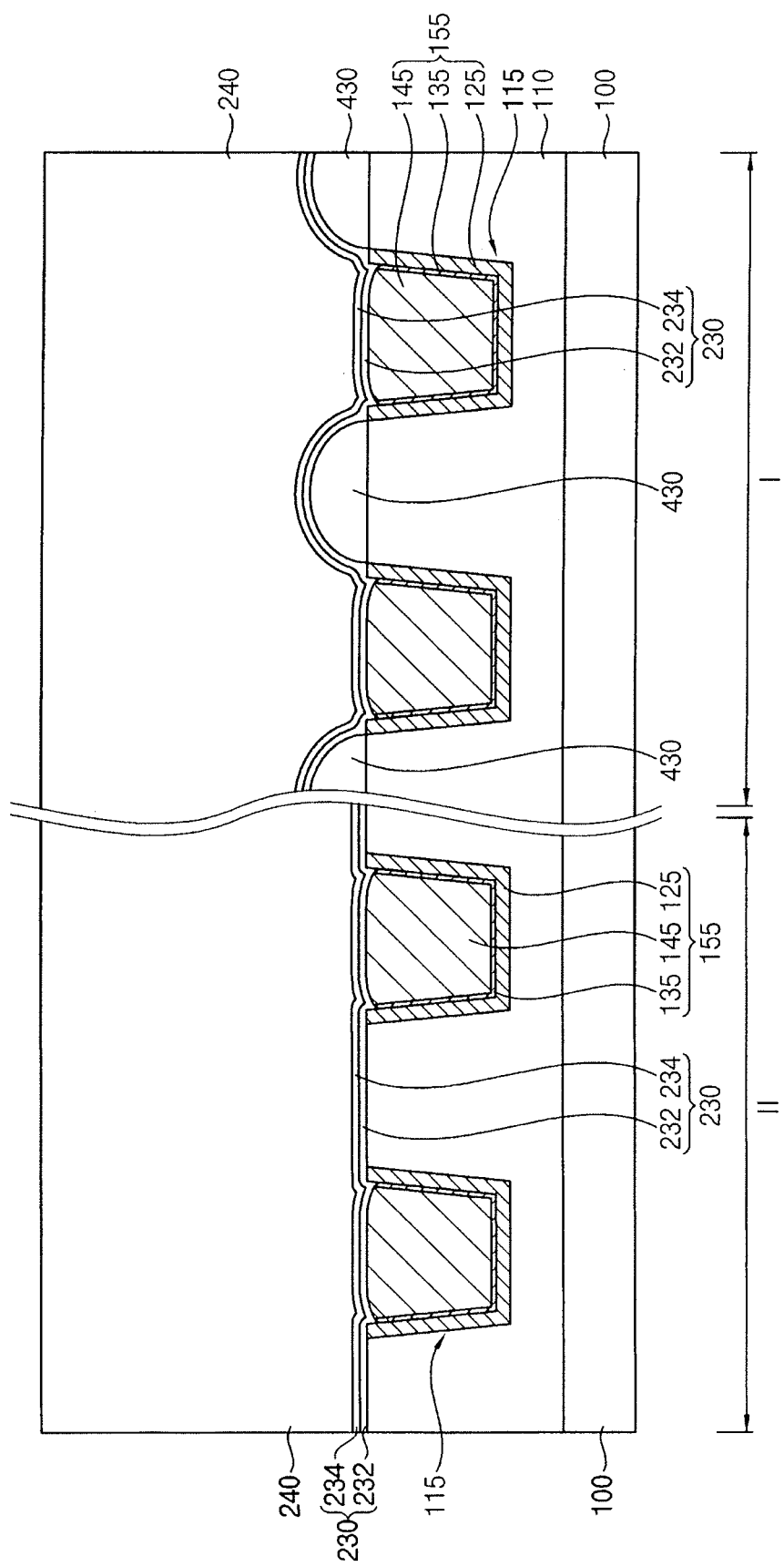
Figure 23:
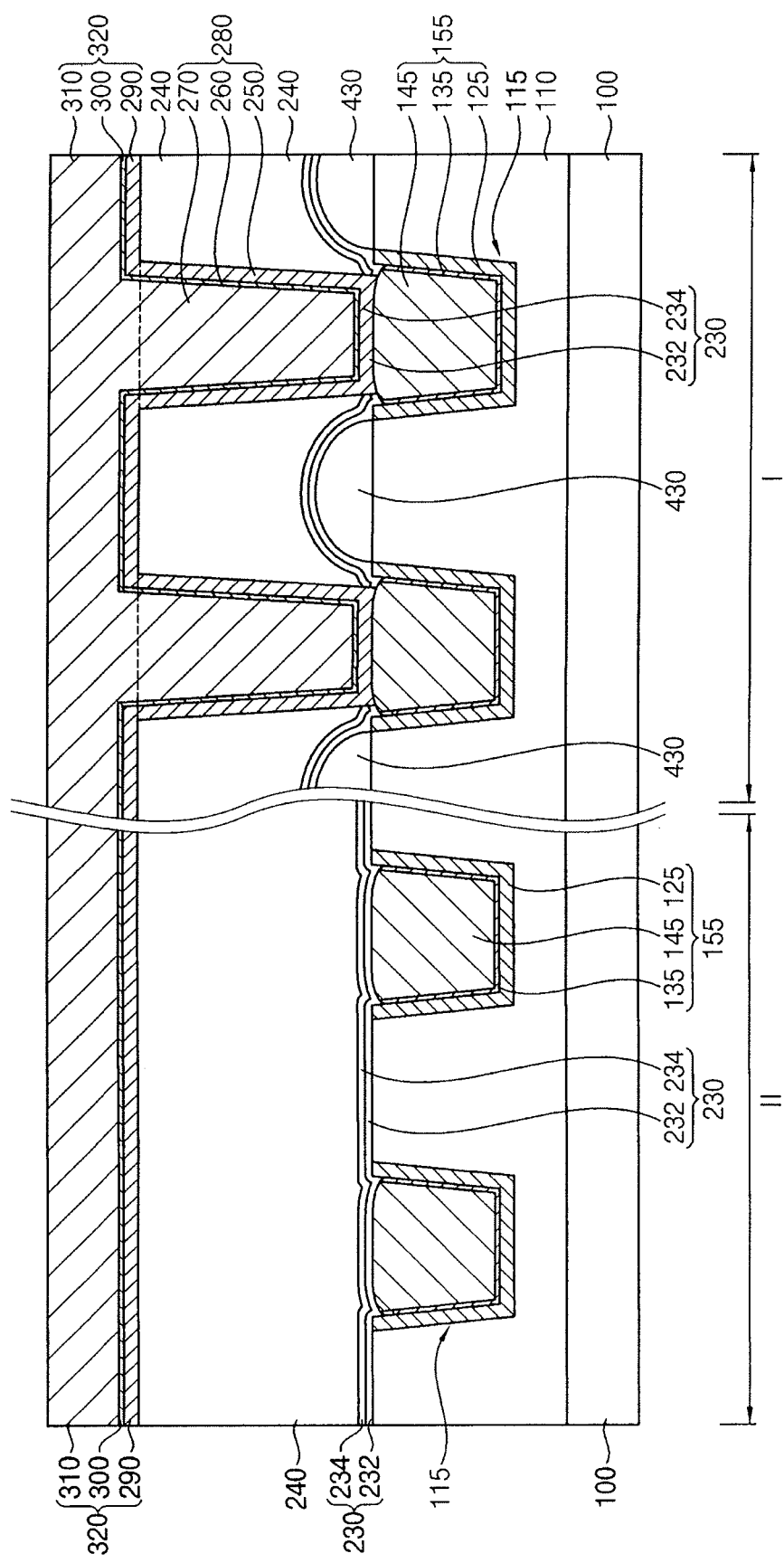
Figure 24:
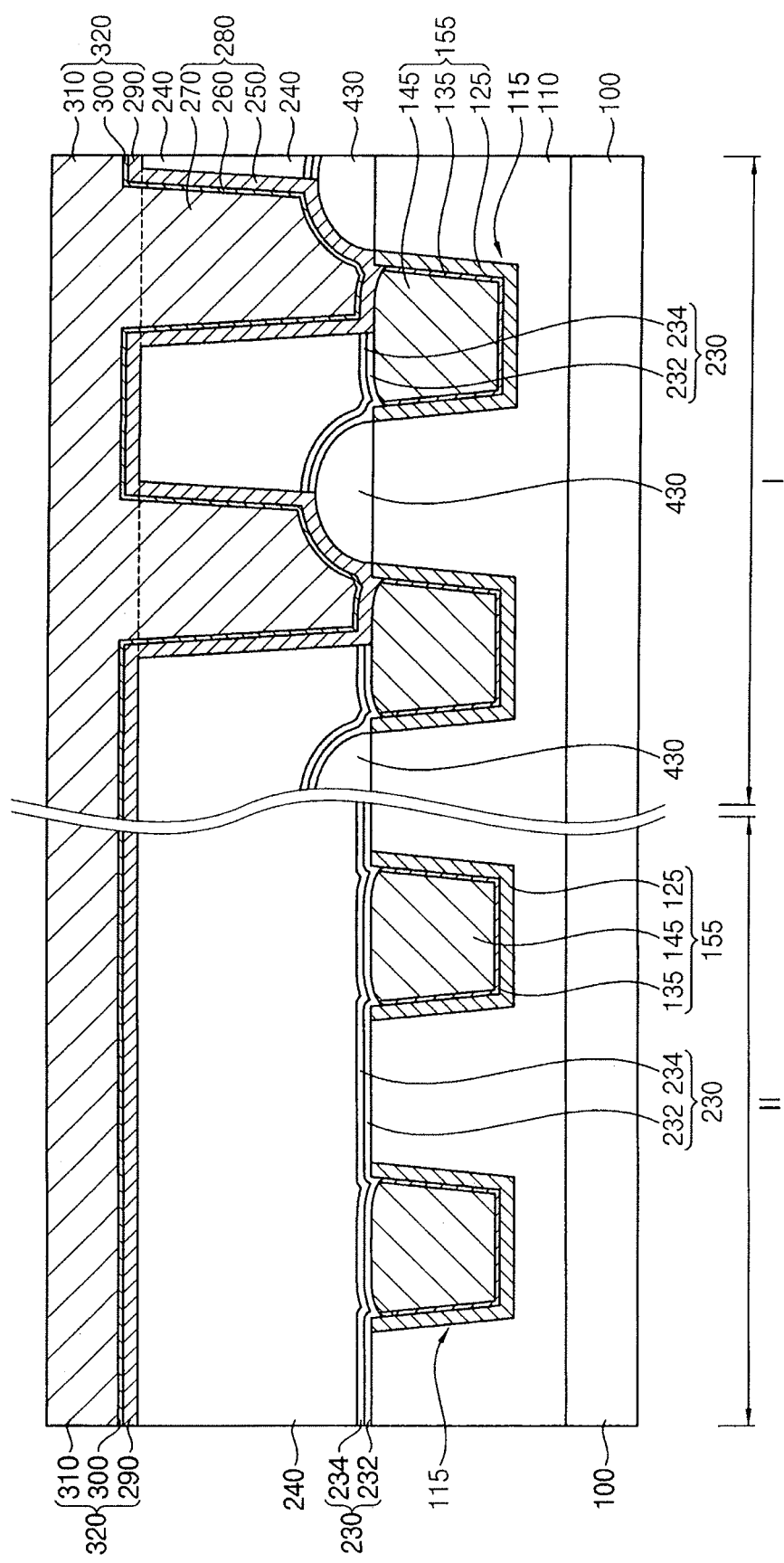

Referring to FIGS. 22-24, processes substantially the same as or similar to the processes described in FIGS. 18 to 20 may be performed to complete the fabrication of the semiconductor device.

In the semiconductor device illustrated in FIGS. 23 and 24, the second insulation pattern 430 may not be formed on the second region II of the substrate 100 on which the via 280 is not formed. For example, unlike the first insulation pattern 210 included in the semiconductor device illustrated in FIGS. 9 and 10, the second insulation pattern 430 may include a high dielectric material. For example, if the second insulation pattern 430 were to also be formed on the second region II of the substrate 100, the RC delay characteristic due to the increase of parasitic capacitance could be degraded. According to the present embodiment, the second insulation pattern 430 including a high dielectric material may be formed only on the first region I of the substrate 100 on which the via 280 is formed, so that the increase of parasitic capacitance may be entirely suppressed.

The above semiconductor devices may be applied to various types of memory devices and systems including wiring structure. For example, the semiconductor may be applied to logic devices such as central processing units (CPUs), main processing units (MPUs), or application processors (APs), or the like, including wiring structure. Additionally, the semiconductor device may be applied to volatile memory devices such as DRAM devices or SRAM devices, or the like, or non-volatile memory devices such as flash memory devices, PRAM devices, MRAM devices, RRAM devices, or the like, including wiring structure.

By way of summation and review, wirings may be formed at minute intervals, and an electrical short could occur between the via and another wiring of the wirings at the lower levels.

One or more embodiments may provide semiconductor devices including a wiring and a via having improved characteristics.

One or more embodiments may provide methods of manufacturing semiconductor devices including a wiring and a via having improved characteristics.

In a semiconductor device in accordance with example embodiments, an insulation pattern may be formed on an insulating interlayer, a distance between a via connected to an upper wiring and lower wirings neighboring with the via may increase, and thus the electrical short margin may increase. For example, an upper surface of the insulation pattern may be higher than an upper surface of the wiring, thereby increasing a distance between the via associated with one wiring and a wiring adjacent to the one wiring (e.g., even if the via were to be misaligned), and reducing or preventing an electrical short. Also, the insulation pattern may include a low dielectric material, so that an increase of parasitic capacitance between the lower wirings and an increase of parasitic capacitance between the upper wiring and the lower wirings may be prevented.

One or more embodiments may provide a semiconductor device and a method of manufacturing the same including a wiring and a via.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate;
    a first insulating interlayer on the substrate;
    a first wiring in the first insulating interlayer on the substrate;
    an insulation pattern on a portion of the first insulating interlayer adjacent to the first wiring, the insulation pattern having a vertical sidewall with respect to an upper surface of the substrate and including a low dielectric material;
    an etch stop structure directly on the first wiring and the insulation pattern;
    a second insulating interlayer on the etch stop structure; and
    a via extending through the second insulating interlayer and the etch stop structure to contact an upper surface of the first wiring,
    wherein the first wiring includes a first metal pattern having a curved top surface with an edge region located below or above an interface between the first insulating interlayer and the insulation pattern.

2. The semiconductor device as claimed in claim 1, wherein a portion of the first insulating interlayer adjacent to the insulation pattern has a carbon concentration that is higher than a carbon concentration of other portions of the first insulating interlayer.

3. The semiconductor device as claimed in claim 1, wherein the insulation pattern includes SiOF, SiOCH, a porous silicon oxide, hydrogen silsesquioxane (HSSQ), methyl silsesquioxane (MSSQ), or a spin on organic polymer.

4. The semiconductor device as claimed in claim 1, wherein the first insulating interlayer and the second insulating interlayer each include a low dielectric material.

5. The semiconductor device as claimed in claim 1, wherein the etch stop structure includes a sequentially stacked first etch stop layer and second etch stop layer.

6. The semiconductor device as claimed in claim 5, wherein:
    the first etch stop layer includes an aluminum oxide or an aluminum nitride, and
    the second etch stop layer includes a silicon carbide, a silicon nitride, or a silicon carbonitride.

7. The semiconductor device as claimed in claim 1, wherein an upper surface of the first insulating interlayer is coplanar with the upper surface of the first wiring.

8. The semiconductor device as claimed in claim 1, wherein an upper surface of the first insulating interlayer is closer to the substrate than the upper surface of the first wiring.

9. The semiconductor device as claimed in claim 1, wherein the first insulating interlayer has a flat upper surface.

10. The semiconductor device as claimed in claim 1, wherein the first wiring includes:
    a first barrier pattern covering a lower surface and a sidewall of the first metal pattern.

11. The semiconductor device as claimed in claim 10, wherein:
    the first wiring further includes a first liner between the first metal pattern and the first barrier pattern, the first liner containing cobalt, and
    an upper surface of a central portion of the first metal pattern and an uppermost surface of the first barrier pattern are farther from the substrate than an upper surface of t edge region of the first metal pattern and an uppermost surface of the first liner.

12. The semiconductor device as claimed in claim 10, wherein:
    the first wiring further includes a first liner between the first metal pattern and the first barrier pattern, the first liner containing ruthenium, and
    an upper surface of a central portion of the first metal pattern is closer to the substrate than an upper surface of the edge region of the first metal pattern and an uppermost surface of the first barrier pattern.

13. The semiconductor device as claimed in claim 1, wherein the via contacts the upper surface of the first wiring and a sidewall and an upper surface of a portion of the insulation pattern adjacent to the first wiring.

14. The semiconductor device as claimed in claim 1, further comprising a second wiring on the via, the second wiring contacting the via.

15. The semiconductor device as claimed in claim 1, wherein:
    the first wiring includes a plurality of first wirings spaced apart from each other in one direction, and
    the insulation pattern is on a portion of the first insulation interlayer between the first wirings.

16. A semiconductor device, comprising:
    a substrate;
    a wiring on the substrate;
    a first insulating interlayer on the substrate, the first insulating interlayer covering at least a part of a sidewall of the wiring, and an upper portion of the first insulating interlayer having a carbon concentration that is higher than a carbon concentration of other portions thereof;
    an insulation pattern on the first insulating interlayer, the insulation pattern including a low dielectric material;
    an etch stop layer directly on the wiring and the insulation pattern;
    a second insulating interlayer on the etch stop layer; and
    a via extending through the second insulating interlayer and the etch stop layer to contact an upper surface of the wiring,
    wherein the wiring includes a metal pattern having a curved top surface with an edge region located below or above an interface between the first insulating interlayer and the insulation pattern.

17. The semiconductor device as claimed in claim 16, wherein the insulation pattern has a sidewall that is substantially orthogonal to an upper surface of the substrate.

18. The semiconductor device as claimed in claim 16, wherein the insulation pattern includes SiOF, SiOCH, a porous silicon oxide, HSSQ, MSSQ, or a spin on organic polymer.

19. A semiconductor device, comprising:
    a substrate including a first region and a second region;
    a first insulating interlayer on the substrate;

a first wiring in the first insulating interlayer on the first region of the substrate;
a second wiring in the first insulating interlayer on the second region of the substrate;
an insulation pattern on a portion of the first insulating interlayer on the first region of the substrate that is adjacent to the first wiring, the insulation pattern including a low dielectric material;
an etch stop structure on the first insulating interlayer, the first wiring, the second wiring, and the insulation pattern;
a second insulating interlayer on the etch stop structure; and
a via extending through the second insulating interlayer and the etch stop structure on the first region of the substrate to contact an upper surface of the first wiring,
wherein the insulation pattern is not formed on the second region of the substrate,
wherein the insulation pattern has a sidewall that is substantially orthogonal to an upper surface of the substrate, and
wherein the first wiring includes a first metal pattern having a curved top surface with an edge region located below or above an interface between the first insulating interlayer and the insulation pattern.

* * * * *